US 9,891,791 B1

(12) United States Patent
Khan et al.

(10) Patent No.: US 9,891,791 B1
(45) Date of Patent: Feb. 13, 2018

(54) GENERATING AN INTERACTIVE GRAPH FROM A BUILDING INFORMATION MODEL

(71) Applicant: Autodesk, Inc., San Rafael, CA (US)

(72) Inventors: Azam Khan, Aurora (CA); Simon Breslav, Toronto (CA); Alexander Tessier, Toronto (CA); Ramtin Attar, Toronto (CA); Michael Lee, Mississauga (CA)

(73) Assignee: Autodesk, Inc., San Rafael, CA (US)

( * ) Notice: Subject to any disclaimer, the term of this patent is extended or adjusted under 35 U.S.C. 154(b) by 241 days.

(21) Appl. No.: 13/945,764

(22) Filed: Jul. 18, 2013

(51) Int. Cl.
*G06F 3/0484* (2013.01)

(52) U.S. Cl.
CPC .................. *G06F 3/0484* (2013.01)

(58) Field of Classification Search
CPC .......... G06F 17/5004; G06F 17/30855; G06F 3/04815; G06F 17/50; G06F 2217/04; G06T 19/003; G06T 17/05; G06T 17/005; G06Q 50/16
See application file for complete search history.

(56) References Cited

U.S. PATENT DOCUMENTS

| | | | |
|---|---|---|---|
| 6,055,541 A * | 4/2000 | Solecki et al. | |
| 6,426,757 B1 * | 7/2002 | Smith | G06T 15/205 345/634 |
| 7,433,744 B2 * | 10/2008 | Bell | 700/59 |
| 9,135,743 B2 * | 9/2015 | Bailiang | G06T 15/10 |
| 2002/0093541 A1 * | 7/2002 | Schileru-Key | G06F 3/04815 715/855 |
| 2006/0033741 A1 * | 2/2006 | Royz | G06T 19/003 345/473 |
| 2006/0218478 A1 * | 9/2006 | Nonclercq et al. | 715/500 |
| 2006/0230011 A1 * | 10/2006 | Tuttle et al. | 706/62 |
| 2008/0012863 A1 * | 1/2008 | Finn | G06T 13/20 345/473 |
| 2009/0031246 A1 * | 1/2009 | Cowtan et al. | 715/786 |

(Continued)

OTHER PUBLICATIONS

"Athens Campus Map & Tour." North Green. Ohio University, n.d. Web. Dec. 4, 2008. <http://web.archive.org/web/20081204051503/http://www.ohio.edu/athens/greens/ngreen.html>.*

*Primary Examiner* — Jennifer To
*Assistant Examiner* — Liang Li
(74) *Attorney, Agent, or Firm* — Fish & Richardson P.C.

(57) ABSTRACT

Methods, systems, and apparatus, including computer programs encoded on computer storage media, for generating presentations of views of building entities according to an interaction graph. One of the methods includes processing building information model data to identify a plurality of building entities, wherein each building entity represents a respective feature of a building modeled by the data. Relationships between different respective pairs of the building entities are determined. The relationships are traversed according to simulated user interactions with respective presentations of a plurality of the building entities. At each subsequent building entity encountered by traversing the plurality of relationships, a respective presentation of a view of the building entity is generated, wherein the respective presentation includes one or more selectable references to one or more other views of one or more other building entities corresponding to one of the determined relationships between the building entities.

20 Claims, 6 Drawing Sheets

(56) References Cited

U.S. PATENT DOCUMENTS

| | | | |
|---|---|---|---|
| 2011/0169826 A1* | 7/2011 | Elsberg | G06T 15/005 345/419 |
| 2012/0203806 A1* | 8/2012 | Panushev | G06Q 50/08 707/825 |
| 2013/0166997 A1* | 6/2013 | Hadley | G06F 17/30864 715/202 |

* cited by examiner

GENERATING AN INTERACTIVE GRAPH FROM A BUILDING INFORMATION MODEL

BACKGROUND

This specification relates to computer-aided designs.

Building information modeling involves digitally representing the characteristics of a building in a building information model (BIM). The BIM data can be used to generate three-dimensional renderings of the building.

SUMMARY

This specification describes how a system can generate and serve presentations of views of building entities, e.g. floors and rooms, to devices in low-bandwidth environments. In general, the system defines hierarchical and connective relationships between building entities defined by a building information model. The system can then generate an interaction graph that represents user interactions that traverse the various relationships between the building entities. The system can then use interaction graph data to generate the presentations as well as embedded references between the presentations that correspond to the simulated user interactions.

In general, one innovative aspect of the subject matter described in this specification can be embodied in methods that include the actions of processing building information model data to identify a plurality of building entities, wherein each building entity represents a respective feature of a building modeled by the data; determining relationships between different respective pairs of the building entities; traversing a plurality of the relationships according to simulated user interactions with respective presentations of a plurality of the building entities; and at each subsequent building entity encountered by traversing the plurality of relationships, generating a respective presentation of a view of the building entity, wherein the respective presentation includes one or more selectable references to one or more other views of one or more other building entities corresponding to one of the determined relationships between the building entities. Other embodiments of this aspect include corresponding computer systems, apparatus, and computer programs recorded on one or more computer storage devices, each configured to perform the actions of the methods. A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

The foregoing and other embodiments can each optionally include one or more of the following features, alone or in combination. The relationships between the building entities comprise hierarchical relationships. The relationships between the building entities comprise connective relationships. The actions include generating multiple layers of each presentation, wherein each layer corresponds to a distinct building context. A building context provides electrical, mechanical, architectural, or plumbing relationships between entities in the building. Each selectable reference comprises a link between two html pages. Generating a respective presentation of the view of the building entity comprises generating one or more selection masks for components of the view of the building entity. The actions include receiving, over a network, an indication of a user interaction with a first presentation of a first building entity; determining that the user interaction is a selection of a reference to a second presentation of a second building entity; and providing the second presentation of the second building entity in response to the indication of the user interaction. Determining that the user interaction requests a second presentation of a second building entity comprises identifying a first node in an interaction graph corresponding to a first view of the first presentation of the first building entity; traversing a link in the interaction graph corresponding to the user interaction, wherein the link connects the first node in the interaction graph and a second node in the interaction graph corresponding to a second view of the second building entity, and wherein providing the second presentation of the second building entity in response to the indication of the user interaction comprises obtaining the second presentation of the second view of the second building entity associated with the second node in the interaction graph.

Particular embodiments of the subject matter described in this specification can be implemented so as to realize one or more of the following advantages. Using an interaction graph to generate presentations of the views of building entities can allow building designs to easily share high-quality renderings of complex building data to user devices in low-bandwidth environments.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

The rich graphics of building data are often difficult to serve in low-bandwidth computing environments, e.g. in web browsers and on mobile devices.

A system can facilitate the serving of building graphics by automatically parsing building entities from a building information model (BIM) and generating an interaction graph by simulating all possible user interactions with presentations of the building entities. A BIM is an electronic representation of physical and functional characteristics of a building or structure. The system can generate images at each node in the interaction graph and links between images to correspond to the simulated user interactions. The generated images and corresponding links can then be served to users over a network.

Figure 1:
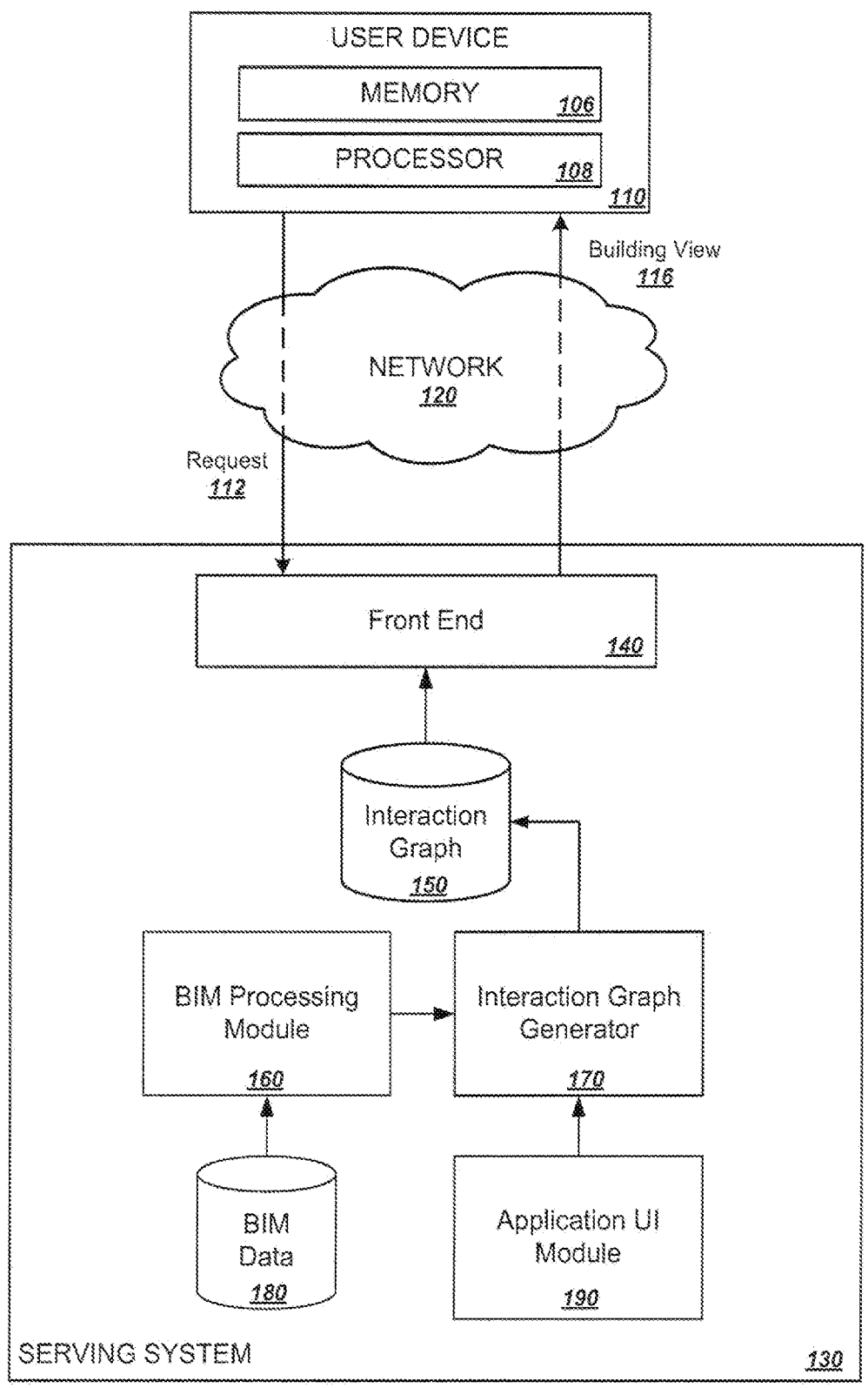
FIG. 1 is a diagram that illustrates an example system.

FIG. 1 is a diagram that illustrates an example system. In general, the system includes a user device 110 such as a data processing apparatus (e.g., a laptop computer, a smart phone, a tablet computer, and so on) coupled by way of network communication with a serving system 130 over a network 120. The serving system 130 is an example computing system in which the systems, components, and techniques described below can be implemented.

In operation, the user device 110 transmits a request 112 to the serving system 130, e.g., over the network 120. The request 112 generally requests a particular view of a building entity generated from a BIM. In general, a "building entity" can refer to aspects of a building represented in the BIM that can be rendered for presentation to a user. Building entities can include objects, e.g. slabs, walls, furniture, lighting fixtures, electrical components, to name a few examples. Building entities can also include defined portions of a building, e.g. floors, rooms, and offices, for example.

The serving system 130 generates a response to the request 112, which is generally a building view 116. In general, a "building view" is a set of one or more layered renderings of a portion the building. For example, a building view can show a room of the building and can have multiple layers corresponding to different contexts, e.g. an electrical context showing electrical components, a mechanical context showing ventilation equipment, a plumbing context showing pipes and other plumbing components, and an architectural context showing walls, floors, and furniture. Depending on the user request 112, the building view can contain multiple context layers composited on top of each other or otherwise combined into a single presentation. The building view 116 can be in the form of any appropriate digital content for presenting building renderings on the user device 110, for example, an image or a markup language document, e.g. an HTML or HTML5 document.

The user device 110 can be any appropriate type of computing device, e.g., mobile phone, tablet computer, notebook computer, music player, e-book reader, laptop or desktop computer, PDA (personal digital assistant), smart phone, a server, or other stationary or portable device, that includes one or more processors 108 for executing program instructions and memory 106, e.g., random access memory (RAM). The user device 110 can include non-volatile computer readable media that store software applications, e.g., a browser or layout engine, an input device, e.g., a keyboard or mouse, a communication interface, and a display device.

The network 120 can be, for example, a wireless cellular network, a wireless local area network (WLAN) or Wi-Fi network, a mobile telephone network or other telecommunications network, a wired Ethernet network, a private network such as an intranet, a public network such as the Internet, or any appropriate combination of such networks.

The serving system 130 can be implemented as one or more computer programs installed on one or more computers in one or more locations that are coupled to each through a network. The serving system 130 includes a front end 140, an interaction graph 150, a BIM processing module 160, an interaction graph generator 170, BIM data, and an application user interface module 190.

In general, the serving system front end 140 receives the request 112 from the user device 110 and also provides the resulting building view 116 to the user device 110. The serving system front end 140 obtains the requested building view 116 from an interaction graph 150.

The interaction graph 150 includes all of the generated layers of each view of building entities of a building, represented by the BIM data 80. Each node in the interaction graph corresponds to a view of a building entity, and each link in the graph corresponds to a user request for a different view of a building entity.

The BIM processing module 160 parses the BIM data 180 and generates geometry data for building entities as well as hierarchical and connective relationships between building entities.

The interaction graph generator 170 receives the building entity data from the BIM processing module 160. The interaction graph generator 170 also receives simulated user interactions with presentations of building entity views and generates the interaction graph 150. Generation of the interaction graph 150 will be described in more detail below.

Figure 2:
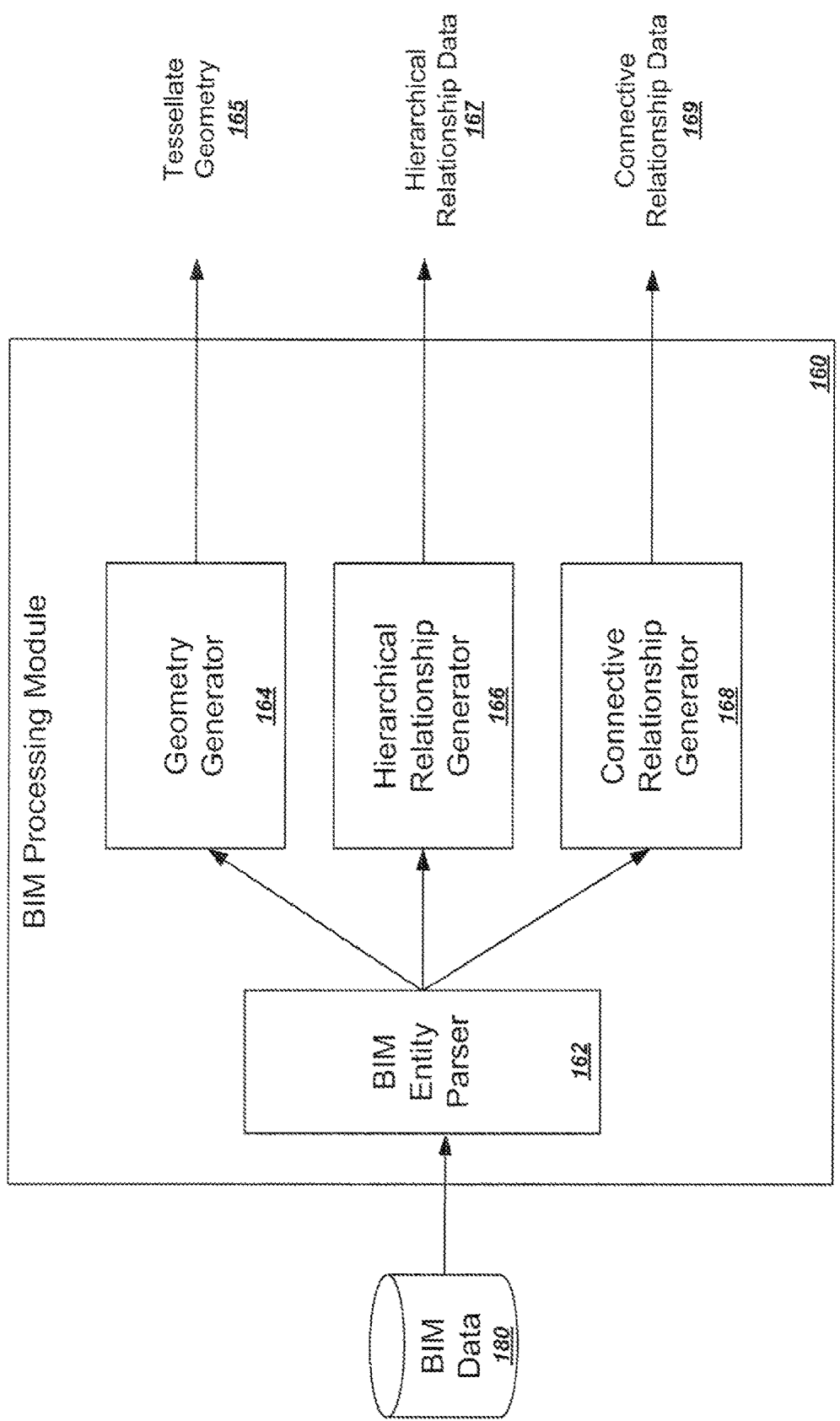
FIG. 2 is a diagram of an example BIM processing module.

FIG. 2 is a diagram of an example BIM processing module 160. The BIM processing module 160 includes a BIM entity parser 162, a geometry generator 164, a hierarchical relationship generator 166, and a connective relationship generator 168. In general, the BIM processing module parses BIM data 180 and generates tessellate geometry 165, hierarchical relationship data 167, and connective relationship data 169 for one or more building entities.

The BIM entity parser 162 parses the textual BIM data 180 to identify building entities.

The geometry generator 164 receives the parsed building entities and generates tessellate geometry 165, e.g. a set of geometric meshes, to be used to render various two-dimensional views of the identified building entities.

The hierarchical relationship generator 166 determines hierarchical relationships between the identified building entities. In some implementations, a hierarchical relationship is a geometrical containment relationship, and two building entities have a hierarchical relationship when space defined by a first building entity substantially contains space defined by another building entity. For example, the hierarchical relationship generator 166 can determine that a building entity representing the entire building has a hierarchical relationship with multiple floor entities. The hierarchical relationship generator 166 can use any appropriate hierarchical arrangement between different classifications of building entities. In some implementations, the hierarchical relationship generator 166 generates hierarchical relationships in which a site entity contains one or more multiple building entities, a building entity contains one or more floor entities, a floor entities contains one or more zone entities, a zone entity contains one or more space entities, and a space entity contains one or more station entities. As an example, when the hierarchical relationship generator 166 encounters a floor entity that is located in a building, the hierarchical relationship generator 166 can define a hierarchical relationship between the building entity and the floor entity. The building entity may be said to have one or more floor entities. Similarly, a floor entity can have multiple room entities, and a room entity can have multiple space entities. The system can also identify additional low level systems in the hierarchical arrangement, for example, furniture, electrical systems, plumbing systems, or heating, ventilation and air conditioning (HVAC) systems in a room, to name a few examples.

The hierarchical relationship generator 166 generates hierarchical relationship data 167 from the determined hierarchical relationships between building entities. In some implementations, the hierarchical relationship generator 166 generates a tree data structure to represent the hierarchical relationship data 167. For example, a root node can represent an entire site entity, and lower level nodes can represent entities that are below the root node in the hierarchical arrangement, for example, one or more building entity nodes.

The connective relationship generator 168 determines connective relationships between building entities, which are not necessarily hierarchical. In other words, the relationship between the entities is not necessarily geometrical. For example, if two rooms are connected by electrical wiring the connective relationship generator 168 can define a connective relationship between the two rooms. Similarly, rooms can also be connected by a doorway, and zones can be connected by a hallway. As another example, a ventilation system can be connected through a ducting system to another ventilation system, which is connected to an electrical system through a junction box. Different building entities can be connected by a variety of connective systems, for example, electrical systems, plumbing systems, HVAC systems, or other types of building systems. After determining the connective relationships between building entities, the connective relationship generator 168 generates connective relationship data 169.

Figure 3:
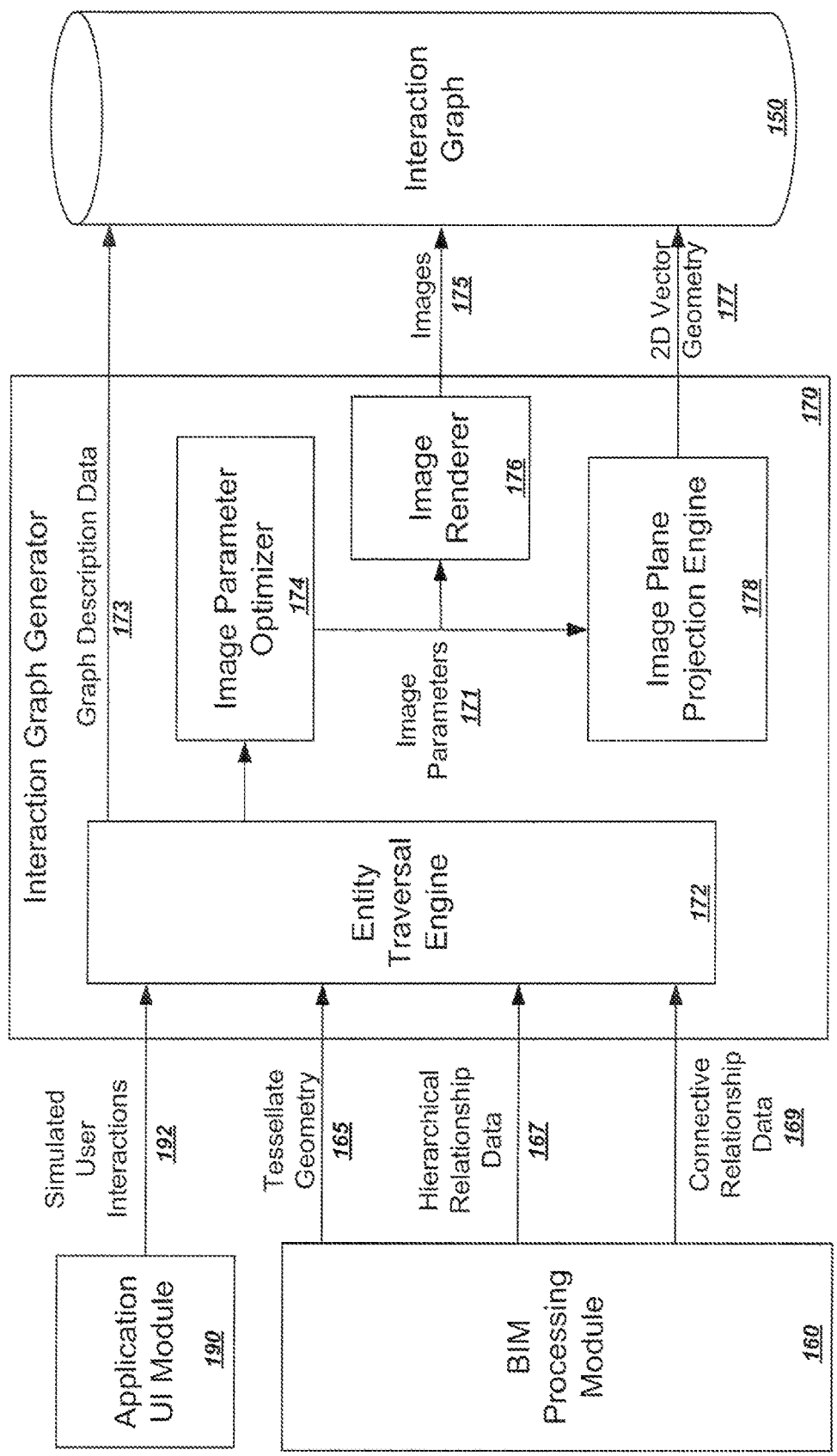
FIG. 3 is a diagram of an interaction graph generator.

FIG. 3 is a diagram of an interaction graph generator 170. The interaction graph generator 170 includes an entity traversal engine 172, an image parameter optimizer 174, an image renderer 176, and an image plane projection engine 178. In general, the interaction graph generator 170 receives simulated user interactions 192, and data about various building entities from the BIM processing module 160, including tessellate geometry 165, hierarchical relationship data 167, and connective relationship data 169. The interaction graph generator 170 then generates a graph description 173 of the interaction graph 150, images 175, and 2D vector geometry 177 of the view of the building entities.

The entity traversal engine 172 uses the hierarchical and connective relationships received from the BIM processing module 160 to traverse to each of the building entities parsed from the BIM data according to simulated user interactions 192. The simulated user interactions 192 will define the nodes and edges of the interaction graph description 173, as well as information included in the images 175.

The simulated user interactions 192 include a set of permitted user interactions with a presentation of a particular view in a graphical user interface (GUI). The application user interface (UI) module 190 defines the permitted user interactions, which can depend on properties of a particular user device. For example, if the user device is a touch-sensitive display, one permitted user interaction can be selection by a user's finger. If the user device is a conventional desktop computer, a permitted user interaction can be a hover with a mouse cursor over a particular portion of the presentation. In general, the application UI module 190 defines user interactions including rollover, hover, point and select, click and drag, mouse wheel scrolling, or any other appropriate type of user input.

Some simulated user interactions 192 correspond to a traversal of the interaction graph 150 to a different view of another building entity, while other simulated user interactions trigger presentation of other information in the same view, e.g. metadata about the building entities or other layers of other building contexts for the building entity. For example, if a user is currently presented with a view corresponding to a floor building entity, a particular interaction, e.g. a mouse wheel scroll, can "zoom in" to another building entity, e.g. a room building entity, that is below the floor building entity as defined by the hierarchical relationship data 167. This interaction results in the presentation of another view corresponding to the room building entity.

Therefore, using both the simulated user interactions and the hierarchical relationship data, the entity traversal engine 172 can generate a node corresponding to the floor building entity, another node corresponding to the room building entity, and a link between the nodes corresponding to the user interaction. The entity traversal engine 172 can then store this generated graph description data 173 of the nodes and links in the interaction graph 150.

Other simulated user interactions may not cause a traversal from one view to a different view. For example, a user clicking with a mouse button cursor positioned on a particular part of a presentation of a floor building entity may simply trigger the presentation of more information about the selected entity. The entity traversal engine 172 provides these non-traversal user interactions to image parameter optimizer 174 to be used to generate images corresponding to the particular view.

At each step of the traversal, the entity traversal engine passes on the tessellate geometry 165 of the corresponding building entities to the image parameter optimizer 174. The image parameter optimizer performs semantic bounding box clipping and camera parameter optimization so that the view of the particular building entity is optimized. The image parameter optimizer can iteratively analyze different angles of each view to determine a maximum number of objects visible in the view. For example, the image parameter optimizer 174 can evaluate a rendering from a particular angle and determine that an item of furniture is covered by another item of furniture. The image parameter optimizer 174 can then adjust the angle so that the item of furniture is not covered.

The image parameter optimizer then passes on the chosen image parameters of a view of an entity to the image renderer 176 and the image plane projection engine 178. The image renderer 176 will render images for the view of the entity according to the different contexts for a particular view and according to user interactions that result in presentation of more information for the view. The generated images 175 are then stored with the corresponding node of the building entity in the interaction graph 150.

Figures 4A, 4B:
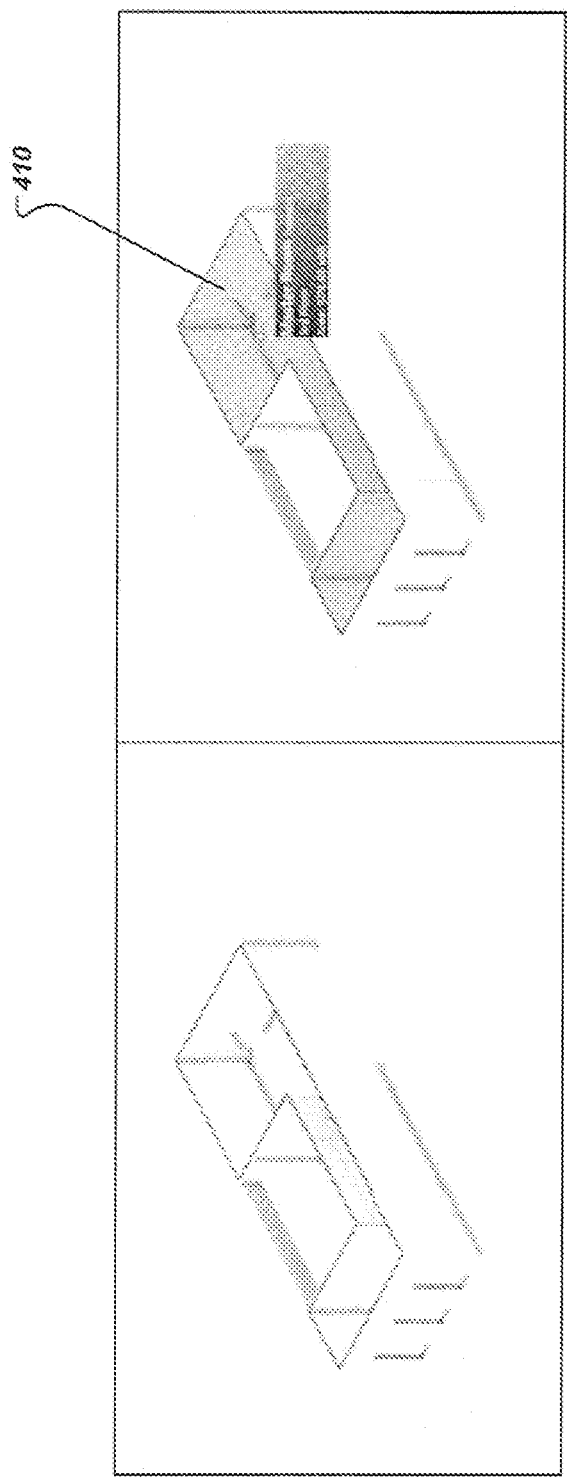
FIG. 4A illustrates an example view of a building entity.
FIG. 4B illustrates an example selection mask.

The image plane projection engine 178 determines the regions of each view that are selectable by a user. FIG. 4A illustrates an example view of a building entity. FIG. 4B illustrates a selection mask 410. The selection mask 410, represented by the shaded area in FIG. 4B, defines one selectable region for the particular view. In this example, the selectable region corresponds to the 2D projection of the view that corresponds to one room of the building entity. The selection mask 410 is an example of 2D vector geometry 177 that can define selectable regions in a particular view. The 2D vector geometry 177 is then stored with the corresponding node of the building entity in the interaction graph 150.

Figure 5:
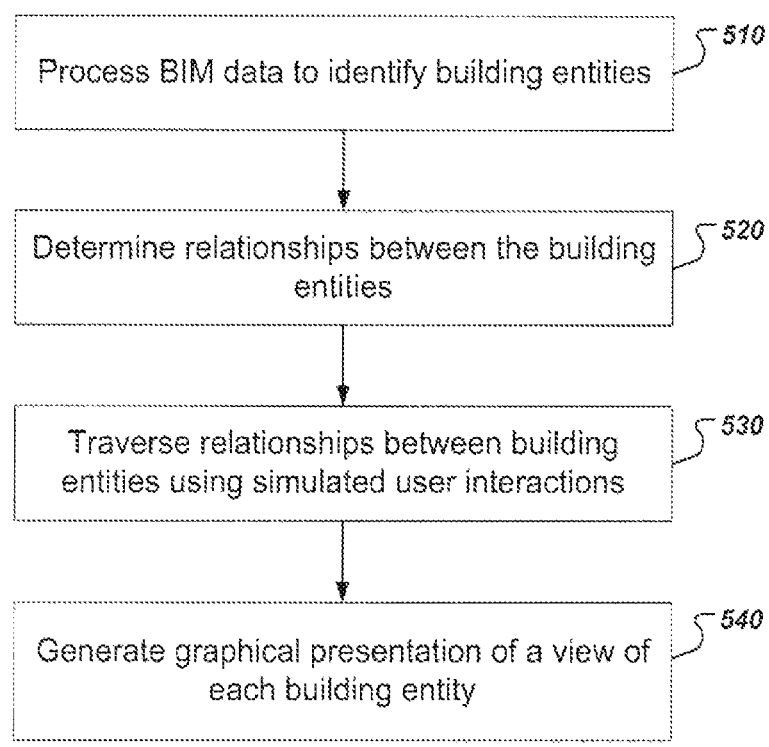
FIG. 5 is a flow chart of an example process for generating an interaction graph.

FIG. 5 is a flow chart of an example process for generating an interaction graph. In general, the system processes building entities from BIM data, traverses relationships between the entities using simulated user interactions, and generates an interaction graph. The process can be implemented by one or more computer programs installed on one or more computers, for example, the BIM processing module 160, the interaction graph generator 170, or some combination of both. The process will be described as being performed by a system of one or more computers, e.g. the serving system 130 of FIG. 1.

The system processes BIM data to identify building entities (510).

The system determines relationships between the building entities (520). The system can determine hierarchical and connective relationships between the building entities, for example, as described above with reference to the hierarchical relationship generator 166 and the connective relationship generator 168.

The system traverses relationships between building entities using simulated user interactions (530). In some implementations, the system starts at a predetermined starting entity, e.g. a root node of a hierarchical arrangement of the building entities, which may correspond to a building site entity. The system can then traverse to other entities according to all possible simulated user interactions with a presentation of each subsequent entity. The system can follow all relationships defined by both the hierarchical relationships the connective relationships data.

The system generates a graphical presentation of a view of each building entity (540). The system can use geometry data of each building entity to generate one or more building context layers for each of one or more views of the building entity. The system will also generate selection masks that define one or more selectable references to other views of other building entities that correspond to one of the relationships between the building entities.

In some implementations, the system generates HTML web pages that include the generated images, and the references to other views of other building entities are links between the corresponding HTML web pages. The system can define selectable areas of the HTML presentation according to the generated selection masks.

Figure 6:
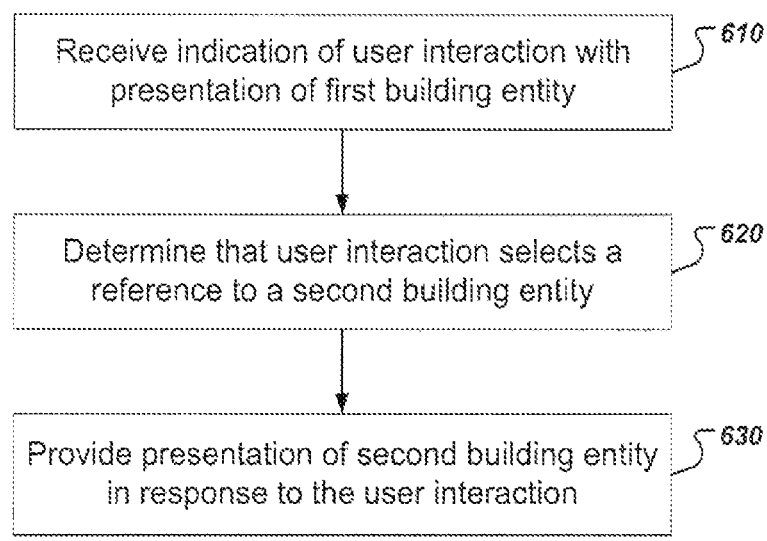
FIG. 6 is a flow chart of an example process for serving presentations of building entity views according to an interaction graph.

The system can then serve the generated presentations to provide high-quality building graphics to computing devices in low-bandwidth environments, e.g. to mobile devices or web browsers. FIG. 6 is a flow chart of an example process for serving presentations of building entity views according to an interaction graph. The process can be implemented by one or more computer programs installed on one or more computers. The process will be described as being performed by a system of one or more computers, e.g. the serving system 130 of FIG. 1.

The system receives an indication of a user interaction with a presentation of a first building entity (610).

The system determines that the user interaction selects a reference to a second building entity (620). For example, the system can determine that the user interaction corresponds to a link in the interaction graph between a first node corresponding to the first building entity and a second node corresponding to the second building entity. The link may represent a hierarchical or connective relationship between the two building entities.

In response, the system can obtain and provide a presentation of the second building entity (630). In some implementations, when the system receives the indication of the user interaction, the system traverses the link in the interaction graph between the first node and the second node and obtains the presentation of the second building entity associated with the second node.

However, the system need not maintain an explicit definition of nodes and links of the interaction graph data. In some implementations, the system rather uses the interaction graph only for generating the presentations and the references to other presentations implicitly maintain the nodes and links of the generated relationships of the interaction graph data. In fact, the system can discard the interaction graph after generating the presentations of the building entities.

The system may nevertheless maintain the interaction graph data and serve the presentations of the building entities for a variety of reasons. For example, if the building information model data is being updated frequently, it may be computationally cheaper to regenerate portions of the interaction graph rather than regenerating the entire interaction graph after each update.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non-transitory program carrier for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. The computer storage medium can be a machine-readable storage device, a machine-readable storage substrate, a random or serial access memory device, or a combination of one or more of them. The computer storage medium is not, however, a propagated signal.

The term "data processing apparatus" encompasses all kinds of apparatus, devices, and machines for processing data, including by way of example a programmable processor, a computer, or multiple processors or computers. The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, or a combination of one or more of them.

A computer program (which may also be referred to or described as a program, software, a software application, a module, a software module, a script, or code) can be written in any form of programming language, including compiled or interpreted languages, or declarative or procedural languages, and it can be deployed in any form, including as a stand-alone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A computer program can be deployed to be executed on one computer or on multiple computers that are located at one site or distributed across multiple sites and interconnected by a communication network.

As used in this specification, an "engine," or "software engine," refers to a software implemented input/output system that provides an output that is different from the input. An engine can be an encoded block of functionality, such as a library, a platform, a software development kit ("SDK"), or an object. Each engine can be implemented on any appropriate type of computing device, e.g., servers, mobile phones, tablet computers, notebook computers, music players, e-book readers, laptop or desktop computers, PDAs, smart phones, or other stationary or portable devices, that includes one or more processors and computer readable media. Additionally, two or more of the engines may be implemented on the same computing device, or on different computing devices.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Computers suitable for the execution of a computer program include, by way of example, can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

While this specification contains many specific implementation details, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous.

What is claimed is:

1. A computer implemented method comprising:
   processing building information model data to identify a plurality of building entities, each building entity representing a respective feature of a building modeled by the building information model data, wherein processing comprises parsing the building information model data to further generate a set of tessellate geometry for each of the plurality of building entities respectively, wherein the set of tessellate geometry is used to render corresponding two dimensional views of each of the plurality of building entities;
   processing a plurality of simulated user interactions corresponding to presentations of the two dimensional views of each of the plurality of building entities, wherein the plurality of simulated user interactions is based on a set of permitted user interactions associated with each corresponding view of the building entity;

determining relationships between different respective pairs of the building entities, including determining a particular relationship between a first building entity and a second building entity;

obtaining data representing an interaction graph for the plurality of building entities, wherein the interaction graph has nodes and links, each node representing a building entity of the building, and wherein each link connects a corresponding pair of nodes and represents a simulated user interaction with a presentation of a building entity represented by a first node of the pair from the processed plurality of simulated user interactions, the simulated user interaction resulting in a request for a presentation of another building entity represented by a second node of the pair;

identifying a first node in the interaction graph corresponding to the first building entity, a second node in the interaction graph corresponding to the second building entity, and a link between the first node and the second node, the link representing a first permitted user interaction from the set of permitted user interactions associated with a first presentation of the first building entity;

generating a first presentation comprising a first predetermined view of the first building entity based on the generated set of tessellate geometry for the first building entity, wherein the first presentation comprises a selectable reference for the first permitted user interaction with the first presentation, the selectable reference representing the particular relationship between the first building entity and the second building entity;

determining a second predetermined view of the second building entity according to the particular relationship represented by the selectable reference in the first presentation;

generating a second presentation based on the generated set of tessellate geometry for the second building entity and comprising the second predetermined view of the second building entity;

after generating the first presentation and the second presentation, receiving, over a network from a user device of a user, a user request for the first presentation of the first predetermined view of the first building entity;

providing the first presentation of the first predetermined view of the first building entity for presentation to the user at the user device;

receiving an indication of user interaction with the selectable reference within the first presentation; and in response to receiving the indication, providing the second presentation of the second predetermined view of the second building entity for presentation to the user at the user device.

2. The method of claim 1, wherein the selectable reference represents a hierarchical relationship between the first building entity and the second building entity.

3. The method of claim 1, wherein the selectable reference represents a connective relationship between the first building entity and the second building entity.

4. The method of claim 1, further comprising:

generating multiple layers for the first presentation, wherein each layer corresponds to a distinct building context of the first building entity.

5. The method of claim 4, wherein a building context provides electrical, mechanical, architectural, or plumbing relationships between entities in the building.

6. The method of claim 1, wherein each presentation comprises an HTML page, and wherein each selectable reference comprises a link between two HTML pages.

7. The method of claim 1, wherein generating the first presentation of the first predetermined view of the first building entity comprises generating a selection mask that defines one or more selectable areas of the first presentation including at least one selectable area corresponding to the selectable reference representing the particular relationship between the first building entity and the second building entity.

8. The method of claim 1, wherein the set of permitted user interactions is based on properties of the user device.

9. A system comprising:

one or more computers and one or more storage devices storing instructions that are operable, when executed by the one or more computers, to cause the one or more computers to perform operations comprising:

processing building information model data to identify a plurality of building entities, each building entity representing a respective feature of a building modeled by the building information model data, wherein processing comprises parsing the building information model data to further generate a set of tessellate geometry for each of the plurality of building entities respectively, wherein the set of tessellate geometry is used to render corresponding two dimensional views of each of the plurality of building entities;

processing a plurality of simulated user interactions corresponding to presentations of the two dimensional views of each of the plurality of building entities, wherein the plurality of simulated user interactions is based on a set of permitted user interactions associated with each corresponding view of the building entity;

determining relationships between different respective pairs of the building entities, including determining a particular relationship between a first building entity and a second building entity;

obtaining data representing an interaction graph for the plurality of building entities, wherein the interaction graph has nodes and links, each node representing a building entity of the building, and wherein each link connects a corresponding pair of nodes and represents a simulated user interaction with a presentation of a building entity represented by a first node of the pair from the processed plurality of simulated user interactions, the simulated user interaction resulting in a request for a presentation of another building entity represented by a second node of the pair;

identifying a first node in the interaction graph corresponding to the first building entity, a second node in the interaction graph corresponding to the second building entity, and a link between the first node and the second node, the link representing a first permitted user interaction from the set of permitted user interactions associated with a first presentation of the first building entity;

generating a first presentation comprising a first predetermined view of the first building entity based on the generated set of tessellate geometry for the first building entity, wherein the first presentation comprises a selectable reference for the first permitted user interaction with the first presentation, the selectable reference representing the particular relationship between the first building entity and the second building entity;

determining a second predetermined view of the second building entity according to the particular relationship represented by the selectable reference in the first presentation;

generating a second presentation based on the generated set of tessellate geometry for the second building entity and comprising the second predetermined view of the second building entity;

after generating the first presentation and the second presentation, receiving, over a network from a user device of a user, a user request for the first presentation of the first predetermined view of the first building entity;

providing the first presentation of the first predetermined view of the first building entity for presentation to the user at the user device;

receiving an indication of user interaction with the selectable reference within the first presentation; and in response to receiving the indication; providing the second presentation of the second predetermined view of the second building entity for presentation to the user at the user device.

10. The system of claim 9, wherein the selectable reference represents a hierarchical relationship between the first building entity and the second building entity.

11. The system of claim 9, wherein the selectable reference represents a connective relationship between the first building entity and the second building entity.

12. The system of claim 9, wherein the operations further comprise:
generating multiple layers for the first presentation, wherein each layer corresponds to a distinct building context of the first building entity.

13. The system of claim 12, wherein a building context provides electrical, mechanical, architectural, or plumbing relationships between entities in the building.

14. The system of claim 9, wherein each presentation comprises an HTML page, and wherein each selectable reference comprises a link between two HTML pages.

15. The system of claim 9, wherein generating the first presentation of the first predetermined view of the first building entity comprises generating a selection mask that defines one or more selectable areas of the first presentation including at least one selectable area corresponding to the selectable reference representing the particular relationship between the first building entity and the second building entity.

16. The system of claim 9, wherein the set of permitted user interactions is based on properties of the user device.

17. A computer program product, encoded on one or more non-transitory computer storage media, comprising instructions that when executed by one or more computers cause the one or more computers to perform operations comprising:

processing building information model data to identify a plurality of building entities, each building entity representing a respective feature of a building modeled by the building information model data, wherein processing comprises parsing the building information model data to further generate a set of tessellate geometry for each of the plurality of building entities respectively, wherein the set of tessellate geometry is used to render corresponding two dimensional views of each of the plurality of building entities;

processing a plurality of simulated user interactions corresponding to presentations of the two dimensional views of each of the plurality of building entities, wherein the plurality of simulated user interactions is based on a set of permitted user interactions associated with each corresponding view of the building entity;

determining relationships between different respective pairs of the building entities, including determining a particular relationship between a first building entity and a second building entity;

obtaining data representing an interaction graph for the plurality of building entities, wherein the interaction graph has nodes and links, each node representing a building entity of the building, and wherein each link connects a corresponding pair of nodes and represents a simulated user interaction with a presentation of a building entity represented by a first node of the pair from the processed plurality of simulated user interactions, the simulated user interaction resulting in a request for a presentation of another building entity represented by a second node of the pair;

identifying a first node in the interaction graph corresponding to the first building entity, a second node in the interaction graph corresponding to the second building entity, and a link between the first node and the second node, the link representing a first permitted user interaction from the set of permitted user interactions associated with a first presentation of the first building entity;

generating a first presentation comprising a first predetermined view of the first building entity based on the generated set of tessellate geometry for the first building entity, wherein the first presentation comprises a selectable reference for the first permitted user interaction with the first presentation, the selectable reference representing the particular relationship between the first building entity and the second building entity;

determining a second predetermined view of the second building entity according to the particular relationship represented by the selectable reference in the first presentation;

generating a second presentation based on the generated set of tessellate geometry for the second building entity and comprising the second predetermined view of the second building entity;

after generating the first presentation and the second presentation, receiving, over a network from a user device of a user, a user request for the first presentation of the first predetermined view of the first building entity;

providing the first presentation of the first predetermined view of the first building entity for presentation to the user at the user device;

receiving an indication of user interaction with the selectable reference within the first presentation; and in response to receiving the indication, providing the second presentation of the second predetermined view of the second building entity for presentation to the user at the user device.

18. The computer program product of claim 17, wherein the selectable reference represents a hierarchical relationship between the first building entity and the second building entity.

19. The computer program product of claim 17, wherein the selectable reference represents a connective relationship between the first building entity and the second building entity.

20. The computer program product of claim 17, wherein the set of permitted user interactions is based on properties of the user device.

\* \* \* \* \*

UNITED STATES PATENT AND TRADEMARK OFFICE
CERTIFICATE OF CORRECTION

PATENT NO. : 9,891,791 B1
APPLICATION NO. : 13/945764
DATED : February 13, 2018
INVENTOR(S) : Azam Khan et al.

It is certified that error appears in the above-identified patent and that said Letters Patent is hereby corrected as shown below:

On the Title Page

Column 1, (54) Title of Invention: Delete "GENERATING AN INTERACTIVE GRAPH FROM A BUILDING INFORMATION MODEL" and insert --GENERATING AN INTERACTION GRAPH FROM A BUILDING INFORMATION MODEL--, therefor.

Signed and Sealed this
Tenth Day of July, 2018

Andrei Iancu
*Director of the United States Patent and Trademark Office*